(12) United States Patent
Weill et al.

(10) Patent No.: US 6,395,616 B1
(45) Date of Patent: May 28, 2002

(54) PROCESS AND APPARATUS FOR REVEALING AN ALIGNMENT MARK ON AN INTEGRATED CIRCUIT WAFER

(75) Inventors: André Weill; Jean-Pierre Panabiere, both of Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/523,256

(22) Filed: Mar. 10, 2000

(30) Foreign Application Priority Data

Mar. 11, 1999 (FR) ............................................. 99 03016

(51) Int. Cl.$^7$ ..................... H01L 21/76; G06F 19/00; C23F 1/02
(52) U.S. Cl. ..................... 438/401; 700/121; 156/345; 29/56.5
(58) Field of Search ............................ 438/401, 7, 8, 438/759; 700/121; 216/17, 18, 19, 39, 52, 56.5; 156/345

(56) References Cited

U.S. PATENT DOCUMENTS

| 4,720,620 A | | 1/1988 | Arima |
| 4,914,601 A | * | 4/1990 | Smyth, Jr. |
| 5,271,798 A | * | 12/1993 | Sandhu et al. |
| 5,786,260 A | | 7/1998 | Jang et al. |
| 6,103,636 A | * | 8/2000 | Zahorik et al. |

FOREIGN PATENT DOCUMENTS

EP 0 482 240 A1 4/1992

OTHER PUBLICATIONS

European Patent Abstract of Japanese Publication No. 63181319 dated Jul. 26, 1988.
European Patent Abstract of Japanese Publication No. 01066091 dated Mar. 13, 1989.
Matsuoka T., et al. "A New Solar Cell Roofing Tile", Solar Cells, XP000147941, vol. 29, No. 4, pp. 361–368.

French Search Report dated Nov. 9, 1999 with Annex to French Application No. 99–03016.

* cited by examiner

Primary Examiner—Keith Christianson
Assistant Examiner—Evan Pert
(74) Attorney, Agent, or Firm—Lisa K. Jorgenson; Stephen Bongini; Fleit, Kain, Gibbons, Gutman & Bongini P.L.

(57) ABSTRACT

A method is provided for locally creating an aperture in a metal layer that is formed above a base wafer having at least one lateral mark provided in its peripheral edge and at least one surface mark provided at a point on its surface. Coordinates of a starting position of a tool with respect to the peripheral edge and the lateral mark are found, and coordinates of the position of the surface mark with respect to the starting position of the tool are calculated so as to determine a course to be followed by the tool from the starting position to a working position above the surface mark. The tool is moved to the working position and activated so as to etch the metal layer and create the aperture in the metal layer above the surface mark. Also provided is a device for locally creating an aperture in a metal layer that is formed above a base wafer. The device includes means for detecting the lateral mark and for detecting at least one point on the peripheral edge of the base wafer so as to set up a reference frame, a tool for etching the metal layer, means for moving the tool with respect to the metal layer, and means for determining a course for the tool and for driving the means for moving so as to place the tool above the surface mark.

24 Claims, 6 Drawing Sheets

PROCESS AND APPARATUS FOR REVEALING AN ALIGNMENT MARK ON AN INTEGRATED CIRCUIT WAFER

BACKGROUND OF THE INVENTION

1. Field of the Invention

The present invention relates to processes and devices for revealing a surface mark on an integrated circuit base wafer, and more specifically to a process for locally creating an aperture in a metal layer formed on one face of a base wafer.

2. Description of Related Art

During the fabrication of an integrated circuit wafer, layers defining stacks of metal, insulating, and semiconducting regions are successively formed on a silicon base wafer. These regions are defined and produced by a photolithography process during which a pattern layout carried by a mask is projected, and each time this mask has to be placed in a defined position with respect to the wafer. The precision of this positioning determines the alignment precision of the various layers successively formed on the base wafer. With a greater resolution, it is possible to increase the number of regions and the number of integrated components per unit area. However, with a greater resolution, there is a greater need to achieve high precision in aligning and superposing the metal, insulating, and semiconducting regions.

According to a first conventional technique, such alignment is achieved with respect to a pattern of marks etched into the surface of the silicon base wafer. The masks possess a corresponding pattern of marks, and the pattern of marks on the masks is aligned with the pattern of marks on the base wafer using the technique of monochromatic laser interferometry. In order to use this technique of alignment by laser interferometry, it is necessary for the marks on the surface of the silicon base wafer to be optically visible. Thus, apertures have to be successively created in the metal levels above each of the surface marks on the silicon base wafer.

A second conventional technique involves regenerating the alignment marks at each level n of the layers in order to be able to align the corresponding mask to the level n+1. In this technique, use is made of systems for recognizing and analyzing images by CCD arrays or systems for analyzing the light diffracted by the alignment marks produced at each level. This second alignment technique (using regeneration of the marks on the base wafer) produces errors at each level which are successively added together. In addition, because of the planarity of the surface of the metal layer, there is no longer a detectable mark and apertures again have to be locally created in this metal layer by removing metal.

Presently, this photolithographic operation is used to locally and successively produce the apertures in the various metal layers. As it is not necessary for the apertures to be produced very accurately, this lengthy and expensive technique is not practically suitable. More specifically, this technique includes the steps of depositing a resin, exposing through a mask to define the apertures to be produced, removing the resin above the apertures to be produced, etching the apertures in the metal layer, and completely removing the resin layer.

SUMMARY OF THE INVENTION

In view of these drawbacks, it is an object of the present invention to overcome the above-mentioned drawbacks and to provide a process for locally creating apertures more quickly and less expensively.

Another object of the present invention is to provide an apparatus for locally creating apertures that is technically and economically better suited to the desired precision.

One embodiment of the present invention provides a method for locally creating an aperture in a metal layer that is formed above a base wafer having at least one lateral mark provided in its peripheral edge and at least one surface mark provided at a point on its surface. According to the method, coordinates of a starting position of a tool with respect to the peripheral edge and the lateral mark are found, and coordinates of the position of the surface mark with respect to the starting position of the tool are calculated so as to determine a course to be followed by the tool from the starting position to a working position above the surface mark. The tool is moved to the working position and activated so as to etch the metal layer and create the aperture in the metal layer above the surface mark. In a preferred method, the tool is used in the working position to bring a drop of an etchant into contact with the surface of the wafer so as to selectively etch the metal layer. In other methods, an excimer laser or polishing head is used to etch the metal layer.

Another embodiment of the present invention provides a device for locally creating an aperture in a metal layer that is formed above a base wafer having at least one lateral mark provided in its peripheral edge and at least one surface mark provided at a point on its surface. The device includes means for detecting the lateral mark and for detecting at least one point on the peripheral edge of the base wafer so as to set up a reference frame, a tool for etching the metal layer, means for moving the tool with respect to the metal layer, and means for determining a course for the tool and for driving the means for moving so as to place the tool above the surface mark. In one preferred embodiment, the device also includes means for activating the tool so as to etch the metal layer and create the aperture in the metal layer above the surface mark.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
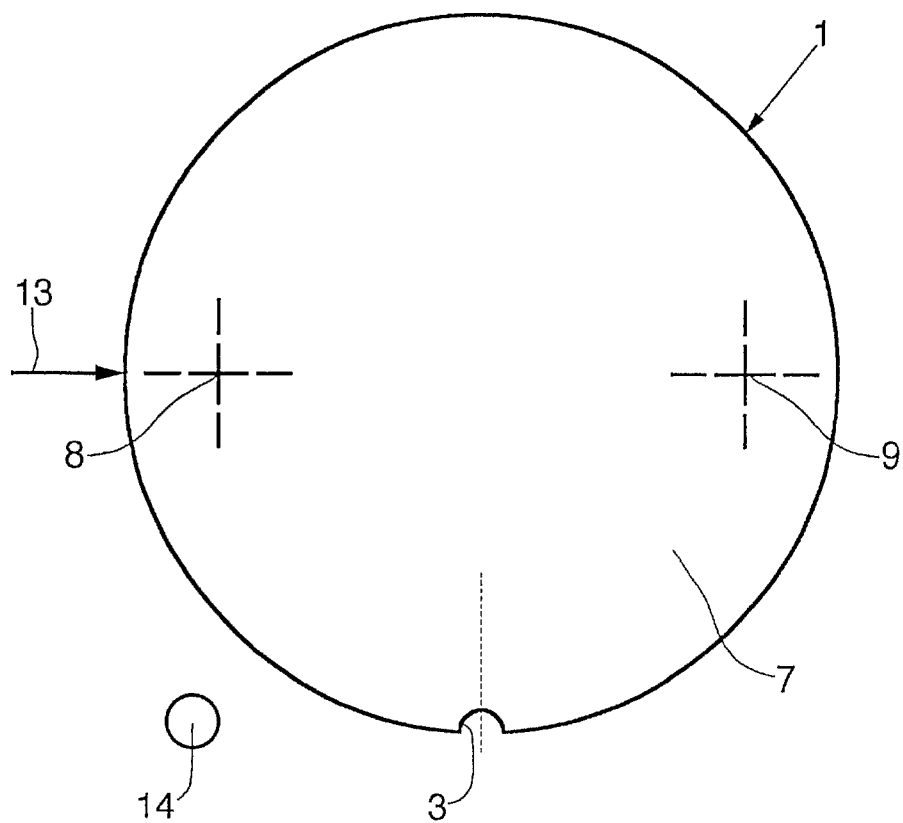
FIG. 1 illustrates a top view of a wafer.
Figure 4:
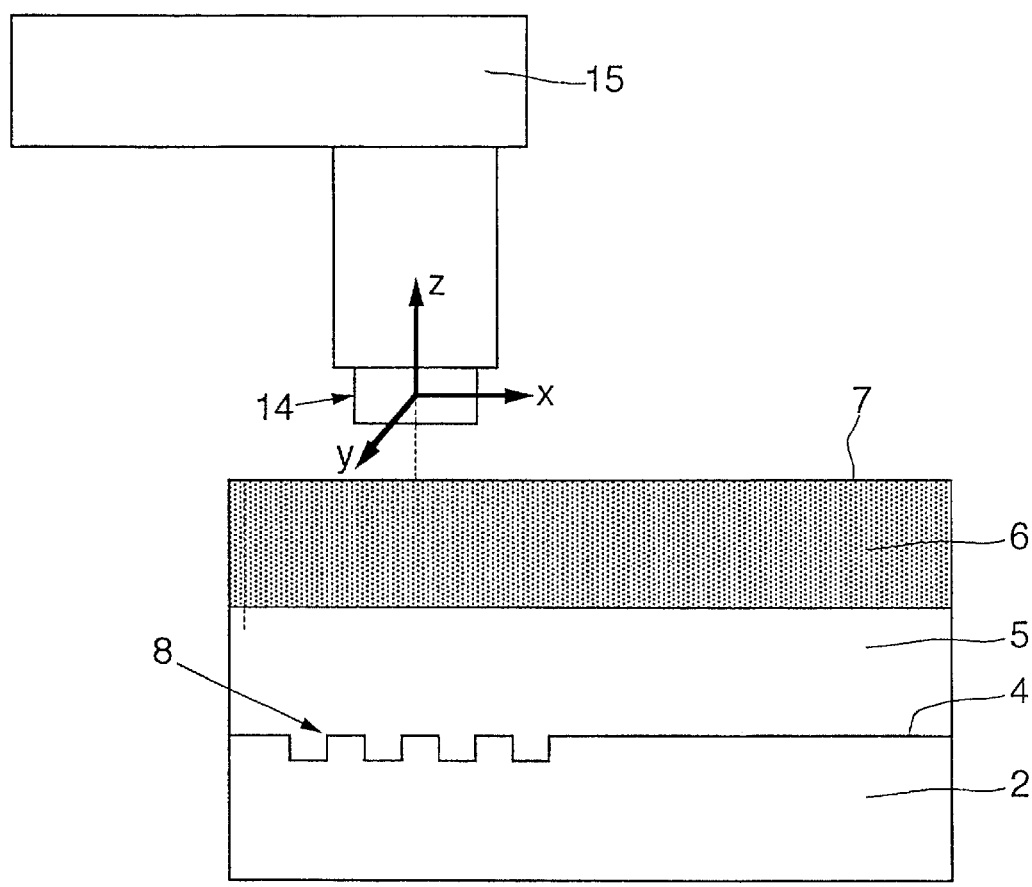
FIG. 4 illustrates an enlarged cross section of the wafer in the region of the marks.

Referring to FIGS. 1 and 4, an integrated circuit wafer is shown during fabrication. The wafer includes a silicon circular base wafer 2 that has a notch 3 forming a lateral mark at a point on the peripheral edge of the wafer. Formed on one face 4 of the base wafer 2 are an oxide layer 5 corresponding to a first level and a metal layer 6 corresponding to a second level. In this exemplary embodiment, the external face of the oxide layer 5 has been previously planarized by mechanical or chemical-mechanical polishing so that the external surface 7 of the metal layer 6 is flat.

Figure 2:
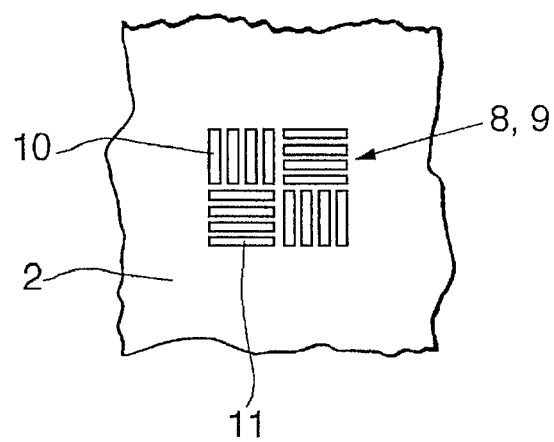
FIG. 2 illustrates an enlarged top view of a surface mark on the wafer.

The silicon base wafer 2 also has surface marks 8 and 9 at two points on face 4. In the exemplary embodiment of FIG. 2, the surface marks 8 and 9 are produced by a succession of hollowed out straight parts 10 that define projecting parts 11, between themselves. These are produced in mutually perpendicular groups so as to constitute a pattern. According to the preferred embodiment which follows a standard construction, the depth of the hollowed parts 10 is equal to 0.12 microns, the width of the hollowed parts 10 and of the projecting parts 11 is equal to 8 microns, and the collection of marks 8 and 9 has a square outline with sides equal to approximately 400 microns. The marks 8 and 9 are produced at particular points on the surface of the base wafer 2, and the coordinates of the points are known with respect to the peripheral edge and the notch 3 of the wafer.

Figure 3:
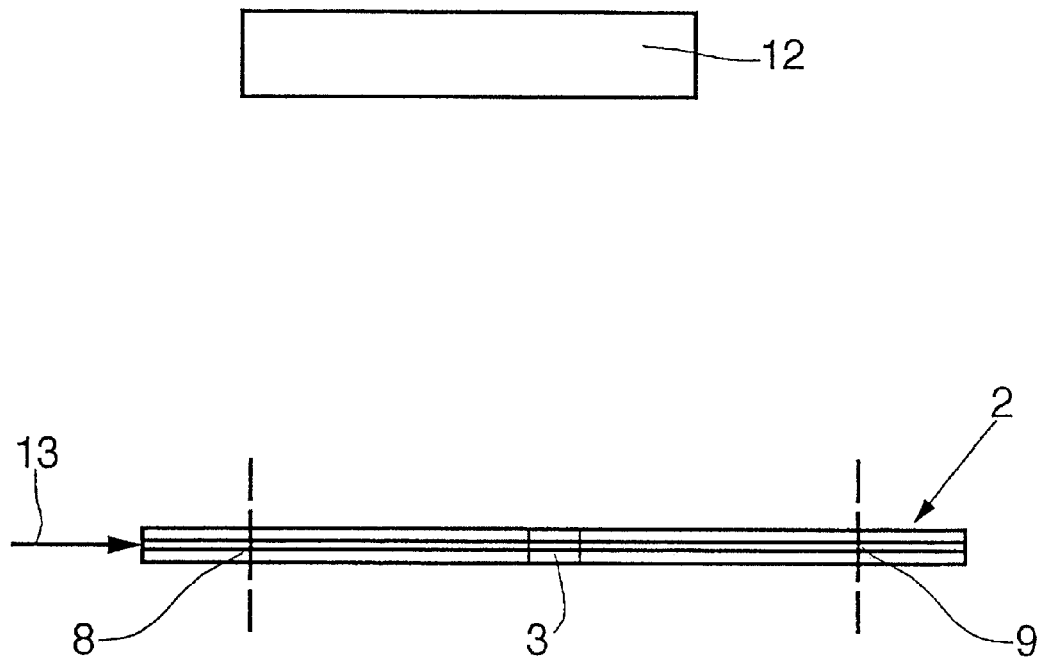
FIG. 3 illustrates a side view of the wafer in a measurement position.

A description will now be given of an exemplary process for producing apertures in the metal layer 6. First, an (x, y) reference frame Rr is set up in the plane of the wafer 2 with the aid of an optical detection apparatus 12, as illustrated in FIG. 3. The apparatus 12 detects the peripheral notch 3 and a point 13 on the peripheral edge of the wafer that lies at 90° with respect to the notch 3. After setting up this reference frame, the coordinates of a starting position Po of a tool 14 are found with respect to the reference frame Rr. As shown in FIG. 4, this tool 14 is carried by an apparatus 15 that allows it to move in (x, y and z).

Then, the coordinates Cm of the surface mark 8 with respect to the starting position Po of the tool 14 are determined by calculation in order to determine a course Co in (x, y) that this tool 14 must follow in order to go from its starting position Po to a working position Pt that lies above the surface mark 8. The tool 14 is then moved by activating the apparatus 15 to the working position Pt above the surface mark 8, as shown in FIG. 4. After the tool 14 is in its working position Pt above the surface mark 8, the tool may then be activated so as to selectively etch the metal layer 6 in order to create an aperture 16, the area of which is preferably significantly greater than the area of the surface mark 8.

Figure 5:
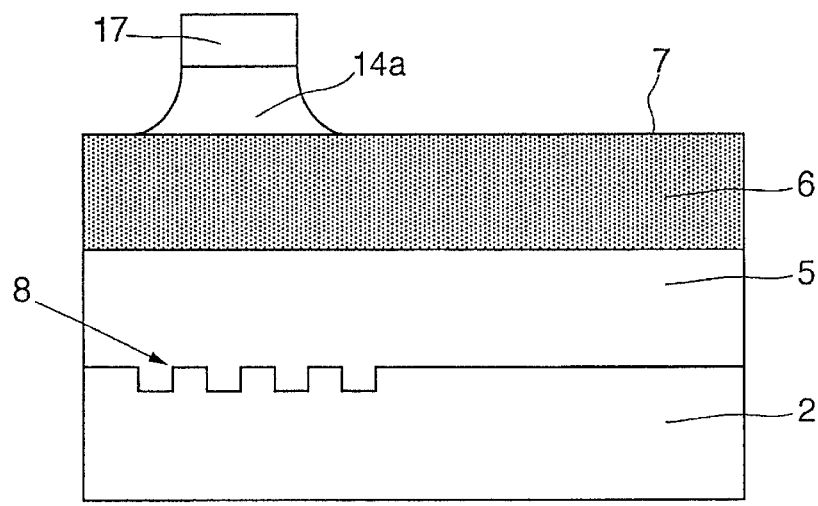
FIGS. 5 to 7 illustrate enlarged cross-sectional views of the wafer in the region of the mark, and a first etching tool.
Figure 6:
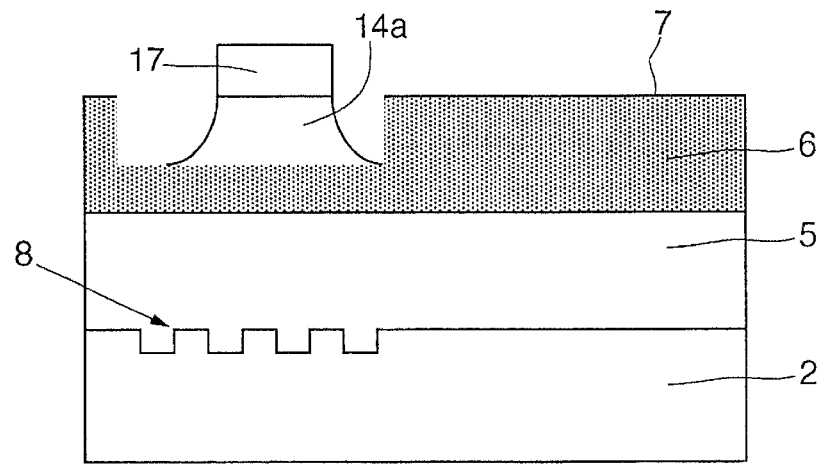
Figure 7:
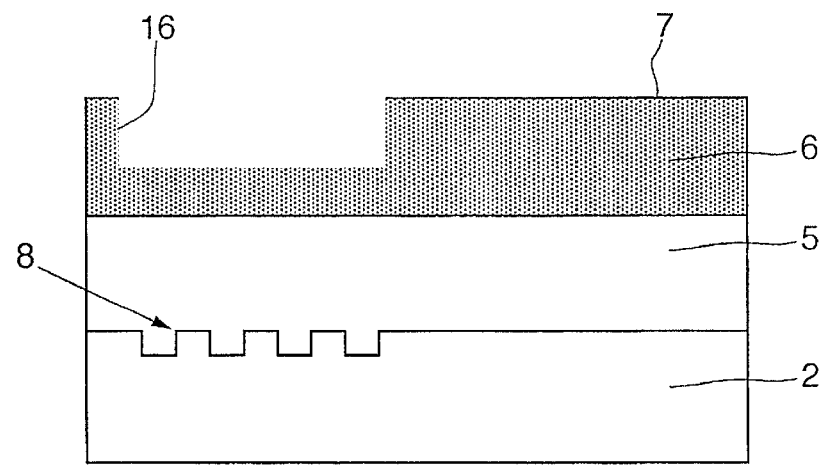

Various tools 14 that are suitable for creating the aperture 16 will now be described. In the embodiment shown in FIGS. 5–7, the tool 14 includes a drop 14a of a chemical that is suitable for selectively etching the metal layer 6. The drop is carried on the end of a drop holder 17 fixed to the movement apparatus 15. This movement apparatus 15 is activated so as to bring the drop 14a into contact with the surface 7 of the metal layer 6. The apparatus 15 is driven so as to move the drop 14a over the surface so as to cover the area of the aperture 16 to be created and to move this drop downwards progressively as the metal layer 6 is etched. When the metal layer 6 is etched right through its thickness down to the subjacent layer 5, without etching the latter, the drop holder 17 sucks up the drop 14a so as to reveal the aperture 16. Preferably, the surface 7 is subsequently washed, especially in the region of the aperture 16 that was created.

Figure 8:
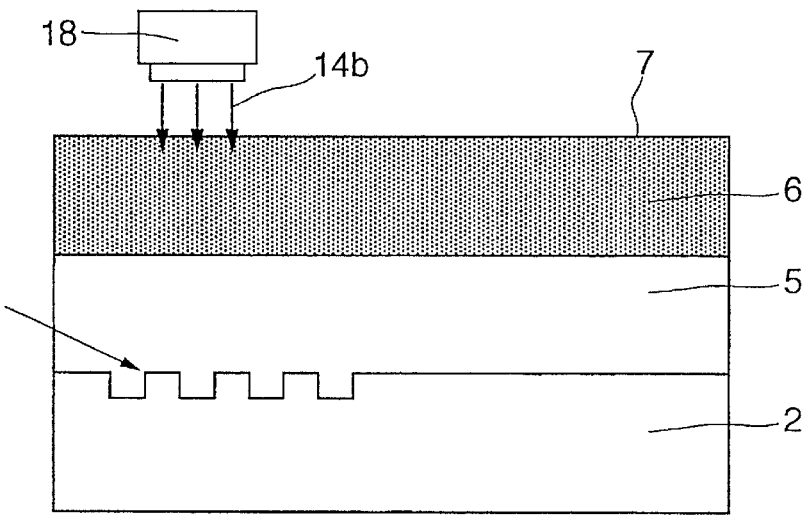
FIGS. 8 to 10 illustrate enlarged cross-sectional views of the wafer in the region of the mark, and a second etching tool.
Figure 9:
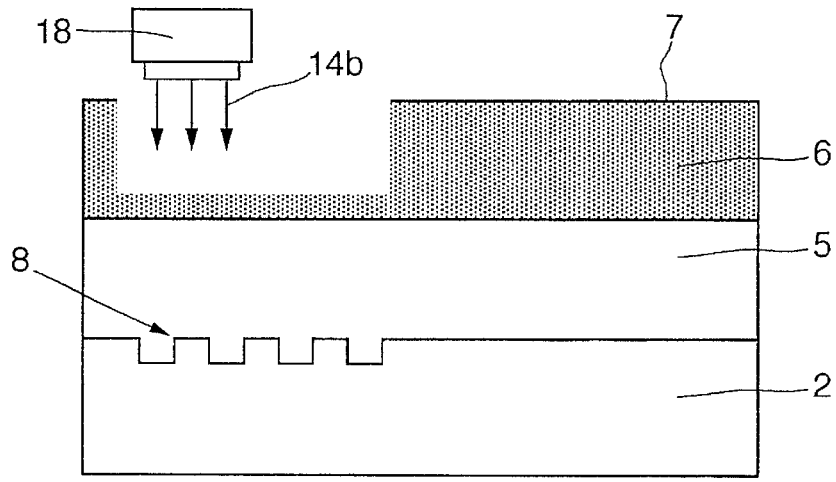
Figure 10:
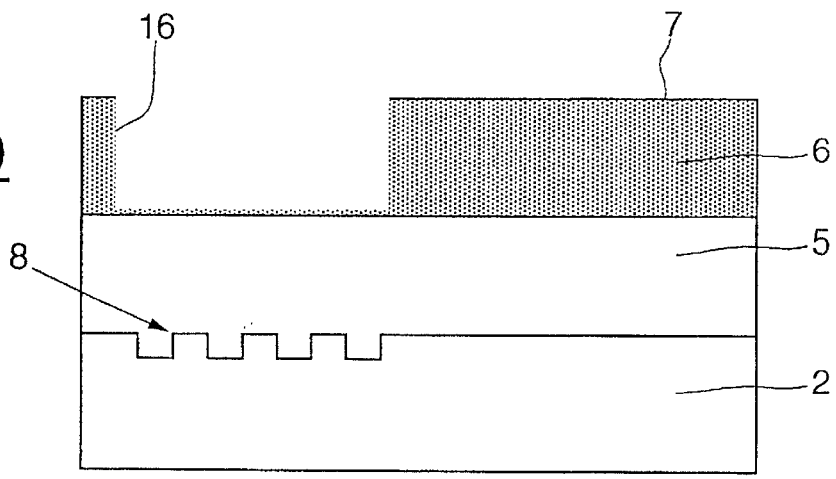

In the embodiment shown in FIGS. 8–10, the tool 14 includes a light beam 14b that is emitted toward the metal layer 6 by an excimer laser emitter 18, which is carried by the movement apparatus 15. As in the previous embodiment, the movement apparatus 15 moves the laser emitter 18 so that the light beam 14a erodes the metal layer 6 by selective photoablation of the metal until the desired aperture 16 is created above the surface mark 8. Preferably, a cleaning of the surface of the wafer 1 is carried out after the aperture 16 has been created, especially in the region of the aperture 16.

Figure 11:
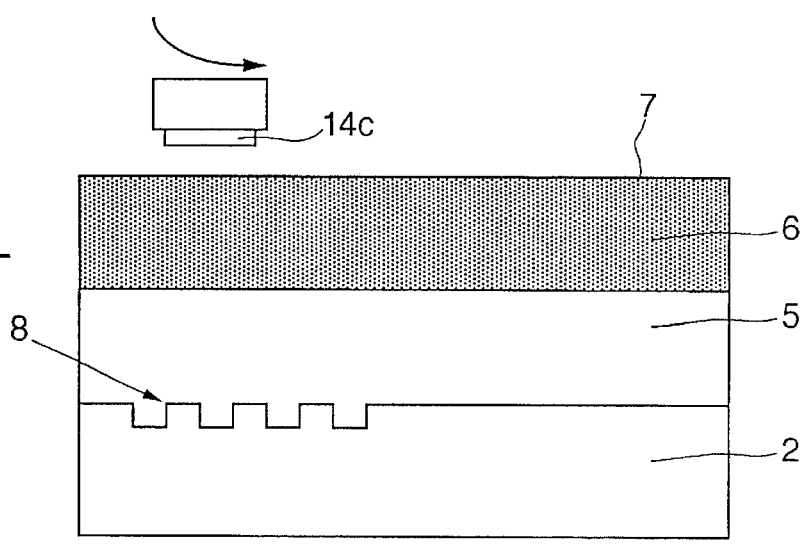
FIGS. 11 to 13 illustrate enlarged cross-sectional views of the wafer in the region of the mark, and a third etching tool.
Figure 12:
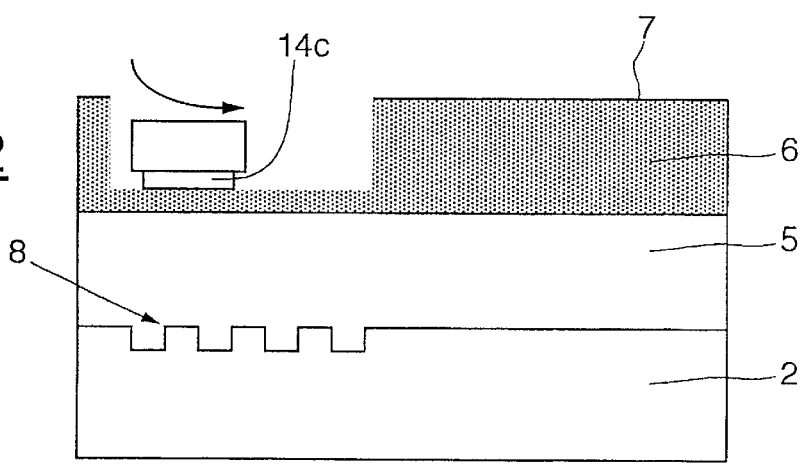
Figure 13:
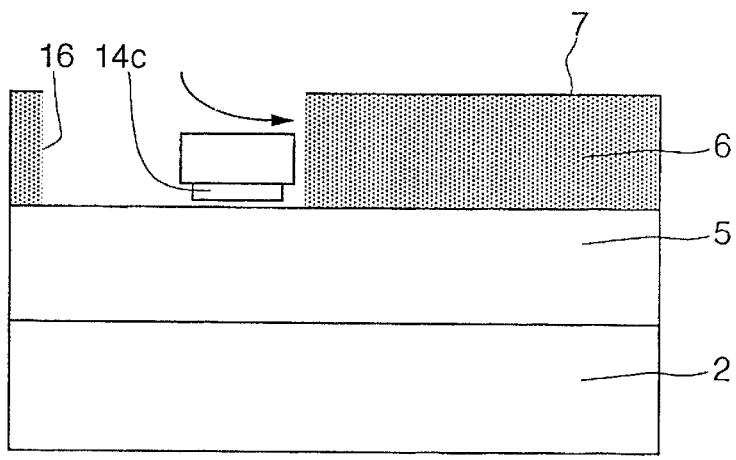

In the embodiment shown in FIGS. 11–13, the tool 14 includes a conventional rotary mechanical or chemical-mechanical polishing head 14c that is designed to create the desired aperture 16. As in the previous embodiments, the movement apparatus 15 moves the polishing head 14c over the surface so as to cover the area of the desired aperture 16 and penetrate the metal layer 6 through its thickness so as to reveal the aperture 16 as far down as the subjacent layer 5, without etching the subjacent layer 5. Also as in the previous embodiments, a subsequent cleaning of the wafer 1 is preferably carried out, especially in the region of the aperture 16 that was created.

A similar procedure is used to create a corresponding aperture 16 above the other surface mark 9 in the metal layer 6. The apertures 16 are thereafter created in subsequent metal layers of the wafer 1, so the surface marks 8 and 9 are optically visible through the apertures 16. Thus, the surface marks 8 and 9 form alignment reference marks that can be used within the context of a subsequent process for photolithographically etching the metal layer 6, with the marks being detectable by monochromatic laser interferometry or the like. The process and operations described above can be carried out using programmed electronic means having known characteristics.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for locally creating an aperture in a metal layer that is formed above a circular base wafer, the circular wafer having at least one lateral mark provided at a first point on the peripheral edge of the wafer and at least one surface mark provided at a point on the surface of the wafer, and the surface mark being located with respect to the peripheral edge of the circular wafer and the lateral mark, said method comprising the steps of:

detecting the lateral mark and at least a second point on the peripheral edge of the circular wafer so as to set up a reference frame;

finding coordinates of a starting position of a tool with respect to the peripheral edge of the circular wafer and the lateral mark;

calculating coordinates of the position of the surface mark with respect to the starting position of the tool so as to determine a course to be followed by the tool from the starting position to a working position above the surface mark;

moving the tool to the working position; and activating the tool so as to etch the metal layer and create the aperture in the metal layer above the surface mark.

2. The method as defined in claim 1, further comprising the step of carrying out an operation for cleaning the surface of the wafer, after the aperture has been created.

3. The method as defined in claim 1, wherein the tool includes a liquid etchant applicator.

4. The method as defined in claim 1, wherein the tool includes an excimer laser emitter.

5. The method as defined in claim 1, wherein the tool includes a rotary head for locally creating the aperture in the metal layer.

6. The method as defined in claim 1, further comprising the step of calculating the position of the surface mark with respect to the positions of the lateral mark and the second point on the peripheral edge of the circular wafer.

7. The method as defined in claim 1, wherein the lateral mark is a notch at the first point on the peripheral edge of the circular wafer.

8. The method as defined in claim 1, wherein the second point on the peripheral edge of the circular wafer lies at 90° with respect to the lateral mark.

9. The method as defined in claim 1, wherein the circular wafer does not have any flats on its peripheral edge.

10. A machine-readable medium encoded with a program for locally creating an aperture in a metal layer that is formed above a circular base wafer, the circular wafer having at least one lateral mark provided at a first point on the peripheral edge of the wafer and at least one surface mark provided at a point on the surface of the wafer, and the surface mark being located with respect to the peripheral edge of the circular wafer and the lateral mark, said program containing instructions for performing the steps of:

detecting the lateral mark and at least a second point on the peripheral edge of the circular wafer so as to set up a reference frame;

finding coordinates of a starting position of a tool with respect to the peripheral edge of the circular wafer and the lateral mark;

calculating coordinates of the position of the surface mark with respect to the starting position of the tool so as to determine a course to be followed by the tool from the starting position to a working position above the surface mark;

moving the tool to the working position; and activating the tool so as to etch the metal layer and create the aperture in the metal layer above the surface mark.

11. The machine-readable medium as defined in claim 10, wherein said program further contains instructions for performing the step of carrying out an operation for cleaning the surface of the wafer, after the aperture has been created.

12. The machine-readable medium as defined in claim 10, wherein said program further contains instructions for performing the step of calculating the position of the surface mark with respect to the positions of the lateral mark and the second point on the peripheral edge of the circular wafer.

13. The machine-readable medium as defined in claim 10, wherein the lateral mark is a notch at the first point on the peripheral edge of the circular wafer.

14. The machine-readable medium as defined in claim 10, wherein the second point on the peripheral edge of the circular wafer lies at 90° with respect to the lateral mark.

15. The machine-readable medium as defined in claim 10, wherein the circular wafer does not have any flats on its peripheral edge.

16. An apparatus for locally creating an aperture in a metal layer that is formed above a circular base wafer, the circular wafer having at least one lateral mark provided at a first point on the peripheral edge of the wafer and at least one surface mark provided at a point on the surface of the wafer, and the surface mark being located with respect to the peripheral edge of the circular wafer and the lateral mark, said device comprising:

means for detecting the lateral mark and for detecting at least a second point on the peripheral edge of the circular base wafer so as to set up a reference frame;

a tool for etching the metal layer;

means for moving the tool with respect to the metal layer; and means for determining a course for the tool and for driving the means for moving so as to place the tool above the surface mark.

17. The apparatus as defined in claim 16, further comprising means for activating the tool so as to etch the metal layer and create the aperture in the metal layer above the surface mark.

18. The apparatus as defined in claim 17, further comprising means for locally moving the tool above the surface mark.

19. The apparatus as defined in claim 17, further comprising means for cleaning the surface of the wafer after the aperture has been created.

20. The apparatus as defined in claim 17, wherein the tool includes a drop of an etchant for selectively etching the metal layer.

21. The apparatus as defined in claim 17, wherein the tool includes an excimer laser emitter.

22. The apparatus as defined in claim 17, wherein the tool includes a head for creating the aperture in the metal layer.

23. The apparatus as defined in claim 16, wherein the means for determining a course for the tool includes:

means for finding coordinates of a starting position of the tool with respect to the peripheral edge of the circular wafer and the lateral mark; and means for calculating coordinates of the position of the surface mark with respect to the starting position of the tool so as to determine the course for the tool that brings the tool from the starting position to a working position above the surface mark.

24. The apparatus as defined in claim 23, wherein the lateral mark is a notch at the first point on the peripheral edge of the circular wafer, and the second point on the peripheral edge of the circular wafer lies at 90° with respect to the notch.

* * * * *